(12) United States Patent
Gogl et al.

(10) Patent No.: US 6,847,568 B2
(45) Date of Patent: Jan. 25, 2005

(54) SENSE AMPLIFIER CONFIGURATION FOR A SEMICONDUCTOR MEMORY DEVICE

(75) Inventors: Dietmar Gogl, Essex Junction, VT (US); Hans-Heinrich Viehmann, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/662,634

(22) Filed: Sep. 15, 2003

(65) Prior Publication Data

US 2004/0218446 A1 Nov. 4, 2004

Related U.S. Application Data

(63) Continuation of application No. PCT/DE02/00897, filed on Mar. 13, 2002.

(30) Foreign Application Priority Data

Mar. 14, 2001 (DE) .......................................... 101 12 281

(51) Int. Cl.[7] .................................................. G11C 7/00
(52) U.S. Cl. ........................................ 365/205; 365/226
(58) Field of Search ............................... 365/205, 196, 365/226, 207

(56) References Cited

U.S. PATENT DOCUMENTS

| | | | |
|---|---|---|---|
| 4,514,828 A | * | 4/1985 | Closson et al. ................. 365/8 |
| 4,742,488 A | * | 5/1988 | Wong ..................... 365/189.06 |
| 5,872,739 A | | 2/1999 | Womack |
| 5,886,931 A | | 3/1999 | Hashiguchi |
| 6,188,615 B1 | | 2/2001 | Perner et al. |
| 2002/0093848 A1 | | 7/2002 | Thewes et al. |

FOREIGN PATENT DOCUMENTS

| | | |
|---|---|---|
| DE | 199 14 488 C1 | 5/2000 |
| EP | 1 104 092 A2 | 5/2001 |

OTHER PUBLICATIONS

Anonymous: "Verstärker zur Verstärkung kleiner Ströme" [amplifier for amplifying low voltages], *Research Disclosure, Jun. 1992, No. 338, pp. 519–522, XP–000315729*.

* cited by examiner

*Primary Examiner*—Thong Q. Le
(74) *Attorney, Agent, or Firm*—Laurence A. Greenberg; Werner H. Stemer; Ralph E. Locher

(57) ABSTRACT

A memory sense amplifier for a semiconductor memory device is provided with a compensation current source device that generates a compensation current and feeds it to an interconnected bit line. The compensation current is selected in such a manner that during readout a potential gradient can be generated and/or maintained in cooperation with a compensation voltage source device on the selected and interlinked bit line device that is substantially constant over time.

46 Claims, 5 Drawing Sheets

SENSE AMPLIFIER CONFIGURATION FOR A SEMICONDUCTOR MEMORY DEVICE

CROSS REFERENCE TO RELATED APPLICATION

This application is a continuation of copending International Application No. PCT/DE02/00897, filed Mar. 13, 2002, which designated the United States and was not published in English.

BACKGROUND OF THE INVENTION

1. Field of the Invention

The invention relates to a sense amplifier configuration for a semiconductor memory device.

Modern semiconductor memory devices have a memory area with a plurality of memory elements or memory cells. The memory elements or memory cells in this case are often produced in a matrix-like configuration and can be addressed via access lines or access lines, for example "bit lines" or "word lines", in order to read and/or to change the memory state or information state of each memory element or of each memory cell.

In this case, addressing and hence access are normally effected using corresponding selection devices on the basis of a row selection, for example for the word lines, and through a column selection, for example for the bit lines. In this context, the system of memory cells configured in matrix form and of the selected and unselected access lines forms a network of nonreactive resistances, with the cell resistances of the individual memory elements or memory cells needing to be taken into account, in particular.

The selection of a corresponding word line and of a corresponding bit line is intended, particularly when reading, to address precisely one well-defined memory cell or one well-defined memory element. Due to the network-like interconnection of the plurality of memory cells in the memory area, however, not only the signal which represents the memory state or information state of the addressed cell but also parasitic signals from the unselected memory elements or memory cells arise and/or access lines which are superimposed on the selected cell's signal which is actually to be detected and analyzed and can result in corruptions.

To suppress these parasitic signals or to minimize them, a sense amplifier is normally used that allows the selected memory area to be isolated from the unselected memory area and the corresponding signals. By way of example, in the case of MRAM storage on cross-point basis, where the memory state or information state of a memory cell is discriminated on the basis of the size of a cell current which is to be detected, a device is provided which sets the potential difference across the unselected memory area such that the current flowing through this unselected memory area does not decisively influence the detection of the cell current which is actually to be evaluated. In this case, by way of example, "compensation voltage source devices" are used which are produced in the sense amplifier configurations, in particular.

A problem in this context is that, under real conditions, the amplifiers used in this case produce a finite, often also varying voltage offset and additionally have only a finite gain. As a result, the control difference means that parasitic signals still arise that are produced and/or supplied by the unselected memory cells on the corresponding bit line.

To overcome this problem, it has to date been possible to use only conventional methods of offset compensation. Prior-art offset compensation circuits operate slowly, however, and require comparatively large areas on the semiconductor layout.

SUMMARY OF THE INVENTION

It is accordingly an object of the invention to provide a sense amplifier configuration for a semiconductor memory device that overcomes the hereinafore-mentioned disadvantages of the heretofore-known devices of this general type and that ensures particularly rapid and reliable reading of the memory device while having a particularly simple, compact, and space-saving configuration.

With the foregoing and other objects in view, there is provided, in accordance with the invention, in a generic-type sense amplifier configuration for a semiconductor memory device or the like, having a memory area including a plurality of memory elements, an input area is provided that is configured to be connected during operation to the memory area, particularly to selected and connected access line devices, preferably bit line devices and/or word line devices for selected memory cells, thereof in order to sense and/or to ascertain a memory state for at least one selected memory element in the memory area. In addition, the generic-type sense amplifier configuration has an output area via which an output signal that represents the ascertained memory state can be output during operation. To minimize parasitic signals, a compensation voltage source device is conventionally provided. This is configured to control a voltage applied to the selected and connected access line device, particularly in relation to an unselected memory area, during operation.

The inventive sense amplifier configuration is characterized in that a compensation current source device is provided. In line with the invention, this is configured to generate an electric compensation current during operation and to supply it to at least one of the access line devices, particularly the selected and connected bit line device. In this case, in line with the invention, the compensation current and/or its time profile can be chosen and/or is configured such that a potential difference that is basically constant over time can be generated and/or maintained during operation, particularly during a read operation or the like and/or particularly in interaction with the compensation voltage source device, on the selected and connected access line device, particularly the selected and connected bit line device and/or particularly in relation to the unselected memory area.

It is thus a fundamental idea of the inventive sense amplifier configuration for a semiconductor memory device to produce a compensation current source device in addition to the compensation voltage source device. The compensation current source device is connected and configured such that it can supply a compensation current to the selected and connected access line device, namely the bit line device, specifically such that the potential difference dropping across the unselected memory area is basically constant over time. This has the advantage over prior-art sense amplifier configurations that the offset voltage Vos of the compensation voltage source device can be explicitly taken into account as well, specifically regardless of its actual value and/or of its time profile. Instead of providing conventional offset compensation—with its drawbacks with regard to its area requirement and the time performance—the invention thus explicitly permits an offset voltage for the compensation voltage source device. The additional and inventively provided compensation current source device then adjusts the compensation current which is to be supplied such that the potential difference across the unselected memory area is at least constant over time. This is because the cell current Ic flowing through the selected memory area, namely the selected memory cell which is to be read, can then be ascertained basically without disturbance by superimposed signals or parasitic signals and can be read in amplified form by the sense amplifier configuration and evaluated.

Particular preference is given to a sense amplifier configuration that is configured to read a memory cell configuration, preferably including MRAM cells or the like.

It is also preferred for the sense amplifier configuration to be configured by reading the memory area in the memory device using an electric current flowing through a selected memory element, particularly a memory cell or the like.

In this case, provision is made for the sense amplifier configuration to be constructed to output a signal in the form of an electric current or the like as output signal.

To generate the potential difference on the access line device, particularly the selected and connected bit line device and/or particularly in relation to the unselected memory area, the compensation voltage source device has first and second input connections, first and second output connections and an inverting amplifier device, particularly an operational amplifier or the like.

In this case, it is also preferred for the first and second input connections to be connected firstly to the noninverting input and the inverting input of the operational amplifier device and secondly via the input area to a, in particular common, deactivation or equalization potential, particularly for the unselected memory area, or to a corresponding access line device, particularly to the system of the unselected word lines, [lacuna] particularly via the selected, connected access line device or bit line device, to the selected memory element.

Another advantage is that one of the output connections of the compensation voltage source device connects the output of the operational amplifier device, particularly via the selected, connected access line device or bit line device, to the selected memory element, so that, overall, the potential difference between the unselected memory area and the selected, connected access line device, particularly the selected and connected bit line device, can be controlled by using feedback, particularly toward a value which is basically constant over time. This ensures particularly simple and nonetheless rapid correction of the potential difference that is present across the unselected memory area.

In line with another advantageous embodiment of the inventive sense amplifier configuration, the compensation current source device is connected by using a first connection thereof to the selected and connected access line device, particularly to the selected and connected bit line device, and consequently particularly to the second input connection and the second output connection of the compensation voltage source device, in order to supply a compensation current at least in part to the selected and connected access line device during operation.

With regard to the operating and control area of the compensation voltage source device, it is particularly advantageous that, in line with another embodiment of the inventive sense amplifier configuration, the compensation current source device is configured to generate and/or provide, during operation, a compensation current having a value that basically corresponds to or sufficiently exceeds the offset's electric current, which corresponds by any voltage offset in the compensation voltage source device via the resistive network of the memory elements in the entire memory area. That is to say that the relationship:

$$Icomp \geq \frac{Vos}{Rpar'\|Rc} = Vos \cdot \frac{Rpar' + Rc}{Rpar' \cdot Rc} = \frac{Vos}{Rpar}$$

is advantageously satisfied, where Rpar signifies the nonreactive resistance of the entire memory area and is basically represented as a parallel circuit including the nonreactive resistance Rpar' of the unselected memory area and the nonreactive resistance Rc of the selected memory area or of the selected memory cell. In addition, Icomp signifies the compensation current and Vos signifies the inherent voltage offset for the compensation voltage source device in this case.

A particular advantage is that the compensation current source device is configured to carry out trimming and/or self-calibration during operation in order to choose a value for the compensation current that is as close as possible to the value:

$$\frac{Vos}{Rpar'\|Rc} = \frac{Vos}{Rpar}.$$

This achieves optimum suppression of parasitic currents or signals in relation to the cell current Ic that is to be analyzed.

For the purpose of analyzing and discriminating the measured cell current or the input signal for the selected memory area, provision is additionally preferably made for an amplification device, particularly a current amplification device or the like, to be produced between the input area and the output area in order to receive, during operation, an input signal that basically represents the memory state of a selected memory element via the input area, to generate an amplified signal therefrom and to output this signal via the output area of the sense amplifier configuration.

To this end, provision is also made for the amplification device to have at least one input connection which is configured to be able to be connected, during operation, to the input area and particularly to the selected and connected access line device, particularly to the selected and connected bit line device, and/or the compensation current source device.

In this context, another advantage is that the amplifier device has an output connection that can be connected during operation to the output area of the sense amplifier configuration.

To implement the amplifier device, provision is made for it to have two transistor devices, particularly in the form of "MOSFETs" or the like, having source, drain and gate regions, and/or connections. In this context, firstly the source regions or connections and secondly the gate regions or connections of these transistor devices are connected to one another. In addition, the drain regions and/or connections of the transistor devices are connected to the input connection and the output connection of the amplifier device. This configuration means that a type of input signal mirror or current mirror having a corresponding gain factor n, which is defined by the respective transistor devices, is implemented between the input connection and the output connection of the amplifier device. An incoming input signal, for example the cell current Ic, is thus output, having been reduced by a compensation current Icomp, in amplified form as an n-times amplified output signal n×Idiff=Iout on the output area of the sense amplifier configuration.

In this case, the amplifier device is additionally advantageously provided with a second input connection that is connected to the gate regions and/or connections of the transistor devices in the amplifier device.

As has been illustrated above, the compensation current Icomp should correspond as much as possible to the ideal value indicated above which is obtained on the basis of the offset voltage Vos of the compensation voltage source device. Often, however, this offset voltage Vos will not be known, or it will even vary over time. The result of this, however, is that in particular cases the generated and supplied compensation current Icomp is large, i.e. an offset current exists here. This can sometimes prevent reliable detection of the cell current Ic and hence ascertainment of the memory state or information content of the selected memory cell.

To get round this offset problem regarding the compensation current Icomp, another embodiment of the inventive sense amplifier configuration advantageously provides for a calibration device to be produced which equalizes an excess compensation current and/or an excess output signal from the amplifier device during operation and which performs current storage and current release functions, particularly such that they can be activated alternately. The effect achieved by this is that, by way of example, a compensation current that is produced before a reading operation and does not take into account a measured cell current Ic, but rather is produced basically on the basis of the offset voltage Vos of the compensation voltage source device, is stored in order to be subsequently supplied back during a reading operation so that it can be deducted the excess compensation current likewise forced by the offset voltage Vos on the output signal Iout, which means that during the reading operation the output signal Iout ultimately basically represents the measured cell current Ic.

The calibration device is disposed between the output connection of the amplifier device and the output area of the sense amplifier configuration, specifically with an input connection and a first output connection thereof, in particular. The effect achieved by this is that the calibration takes place directly upstream of the output area of the sense amplifier configuration, and hence the output signal Iout can be directly influenced if appropriate.

The calibration device advantageously has a second output connection. The second output connection is connected to the second connection of the compensation current source device.

In addition, the calibration device is equipped with a current storage device in order to perform the current storage or current release functions.

In this case, it is preferred for the current storage device to be configured to store an excess compensation current and/or an excess output signal during operation before a reading state and to supply it/them again, at least in part, during a reading state, particularly from the compensation current source device and/or the amplifier device or to it/them.

The current storage configuration is of particularly simple configuration if it is the form of a transistor device, particularly in the form of a MOSFET or the like, or has such a transistor device.

In this context, provision is then made for the transistor device to be connected by its drain region to the input connection of the calibration device and by its source region via the second output connection of the calibration device to the compensation current source device.

Provision is also made for the current storage device to have a switching device and for the opposing region of the transistor device and of the current storage device to be able to be connected to and isolated from the drain region before and during a reading state in the sense amplifier configuration. The effect achieved by this is that particularly the gate capacitor in the gate region of the transistor device in the current storage device can be switched as a current storage element.

In addition, provision is advantageously made for the calibration device to have a further switching device which, during operation, can make a direct electrical connection between the input connection and the first output connection of the calibration device during a reading state and can break it before a reading state. The effect achieved by this is that, before a reading state, the generated output signal, which is likewise in excess due to the excess current compensation and thus would not be interrupted as a logic "0", does not appear on the output area of the sense amplifier configuration. On the other hand, the storage and release functions with respect to the storage current through the calibration device during a reading state in the sense amplifier configuration means that the second switching device currently switches a correspondingly reduced output signal Iout to the output area of the sense amplifier configuration.

Other aspects and characteristics of the present invention can be found in the description below:

The reading operation in an MRAM memory based on a cross-point array differs fundamentally from the reading operations in other memory devices, for example DRAMs, EEPROMs, or the like.

To read the content of an MRAM memory cell from a matrix of cross-point cells, the word line containing the selected memory cell is first brought to the required reading voltage Vwl. All the unselected word lines are, by contrast, at an equalization voltage or equipotential voltage Veq. This voltage differs from the word line voltage or reading voltage Vwl. The unselected bit lines are also at the equipotential voltage or equalization voltage Veq. The bit line for the selected memory cell is connected to the input of a sense amplifier by using a corresponding column multiplexer or a corresponding column selection device. In this case, the sense amplifier will ideally hold the selected bit line at the potential Veq, which is thus equal to the potential on the unselected word lines.

The voltage difference Veq–Vwl thus drops across the selected memory cell. In line with the MRAM concept, this results in a flow of current Ic through the selected memory cell. The word line voltage or reading voltage Vwl must be different than the equipotential voltage or equalization voltage Veq, but can otherwise be lower or higher than the voltage Veq.

In line with the MRAM concept, the selected memory cell has a high or a low nonreactive resistance Rc, depending on the programming state, specifically on the basis of whether opposite or equal orientations of the magnetizations of the soft-magnetic layer and of the hard-magnetic layer exist in the vicinity of the magnetic tunnel layer (MTJ: magnetic tunneling junction). This high or low nonreactive resistance Rc of the selected memory cell results in a low or high flow of current Ic through the selected memory cell. The respective cell current Ic is then evaluated via the selected bit line by the sense amplifier or the sense amplifier configuration and is interpreted and/or output as a logic "0" or "1".

Under ideal conditions, the selected bit line and the unselected word lines and bit lines are held at the same potential, namely the equalization or equi-potential potential Veq. Consequently, parasitic currents ideally do not arise as parasitic signals through the unselected memory cells, or they are eliminated.

Every real amplifier and hence every real compensation voltage source device has an offset voltage and a finite gain. This means that the sense amplifier configuration does not control the voltage of the selected bit line exactly to the value of the equalization voltage or equipotential voltage Veq. The voltage control difference means that parasitic currents arise, specifically through the unselected memory cells that are on the selected bit line.

One option for reducing this voltage control difference and hence the parasitic currents or signals would conventionally be to use a precision amplifier that allows the voltage on the selected bit line to be brought as close as possible to the equipotential voltage Veq. This conventionally requires time-consuming and slowly operating offset compensation circuits that may be connected to an increased area requirement in the semiconductor layout.

Even if the voltage at the end of the selected bit line is set ideally by a conventional sense amplifier, however, a corresponding cell current Ic via the nonreactive resistance Rc of the selected memory cell would produce a voltage drop across the selected bit line, which would then in turn produce corresponding, albeit small, parasitic currents for the transversely running unselected word lines.

The present invention proposes a circuit for a rapid and compactly constructed sense amplifier which is insensitive to the unavoidable control errors due to the unavoidable offset voltages for a finite gain.

In this case, despite parasitic effects, such as offset voltages, the finite gain and the voltage drops across the bit lines with a small area [lacuna] rapid evaluation of the programming state of a selected memory cell which is to be read becomes possible.

Other features that are considered as characteristic for the invention are set forth in the appended claims.

Although the invention is illustrated and described herein as embodied in a sense amplifier configuration for a semiconductor memory device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
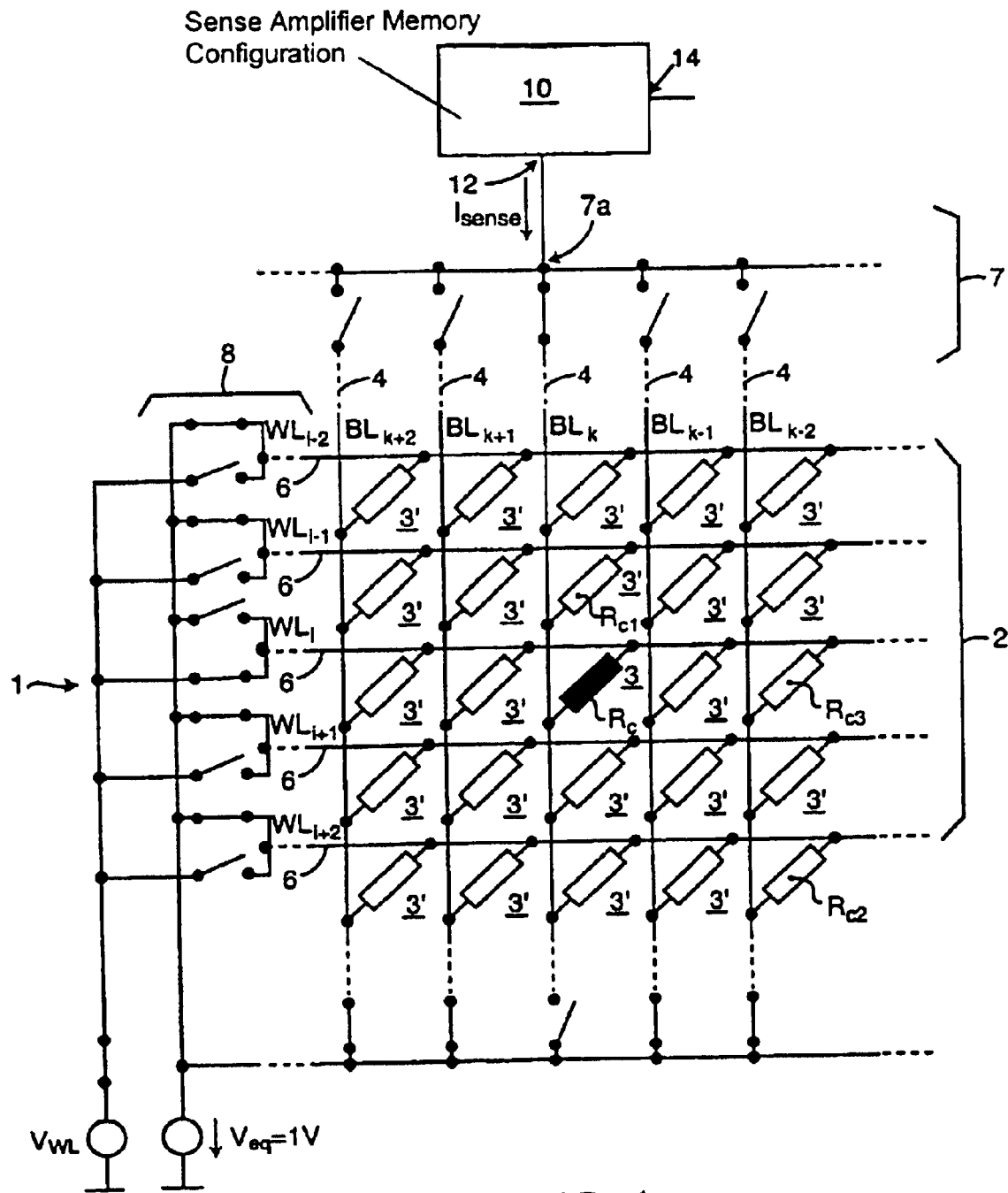
FIG. 1 is a circuit diagram showing a memory device using a sense amplifier configuration according to the invention.

Referring now to the figures of the drawings in detail and first, particularly to FIG. 1 thereof, there is shown a schematic circuit configuration to show the fundamental configuration of a semiconductor memory device 1 using an inventive sense amplifier configuration 10.

The semiconductor memory device 1 has a memory area 2. This includes a matrix-like configuration of memory cells 3 and 3', the memory cells or memory elements 3' not having been selected for reading in the state of the semiconductor memory device 1 that is shown in FIG. 1. By contrast, the memory element 3 in the memory area 2 has been selected for reading. For this selection, the word line WLi is implemented together with the bit line BLk of the access line devices 6 and 4 by corresponding switching states of the row selectors or multiplexers 8 and column selectors or multiplexers 7. The selected word line WLi is at the word line voltage or reading voltage Vwl. All unselected word lines and bit lines of the access line devices 6 and 4 are at the equipotential voltage Veq. Ideally, the selected bit line BLk is also at the equipotential voltage Veq at its end, namely on the node 7a and thus in the input area 12 of the inventive sense amplifier configuration 10.

The selected cell 3, which is connected to the word line WLi and the bit line BLk, has a cell resistance Rc which, due to the voltage Veq–Vwl dropping across the nonreactive resistance Rc, results in a corresponding cell current Ic which, in the undisturbed state, currently, responds to the measured current Isense.

First of all, the configuration and manner of operation of a prior-art sense amplifier configuration 100 will be explained with reference to FIG. 5.

This conventional sense amplifier configuration 100 has a compensation voltage source device 20 with input connections 21 and 22 and output connections 23 and 24. In this configuration, the input connections 21 and 22 are connected via the input area 12 to the equalization potential Veq and to the selected bit line BLk of the access line device 4.

A core element of the compensation voltage source device 20 is an operational amplifier 25 having a non-inverting input 25-1 and an inverting input 25-2. The output 25-3 of the operational amplifier 25 is connected to a MOSFET T1, namely to its gate G1. The drain region D1 and the source region S1 form the output connections 23 and 24 of the compensation voltage source device 20. The operational amplifier device 25 has a finite gain factor A and an offset voltage Vos (shown schematically).

The input area 12 connects the conventional sense amplifier configuration 100 to the memory area 2. The unselected memory cells 3' in the memory area 2 form the unselected memory area 2'. This area is connected in parallel, in terms of resistance, with the selected memory cell 3 (which has a nonreactive resistance Rc) and has a nonreactive resistance Rpar'.

In addition, an amplifier device 40 is provided that is produced between the first output connection 23 of the compensation voltage source 20 and the output area 14 of the sense amplifier configuration 100. This amplifier device 40 is used to amplify the incoming measured current Isense n times to form an output signal Iout. To this end, two transistor devices T2 and T3 are provided as MOSFETs whose source and gate regions S2, S3 and G2, G3 are respectively connected to one another in conductive fashion and also to the first output connection 23 of the compensation voltage source device 20. In this way, a current mirror is produced for the measured current Isense in relation to the source follower T1.

The nonreactive resistance Rc of the selected cell 3 is grounded by the selected bit line BLk via the word line voltage or the reading voltage Vwl. The remaining unselected memory cells 3' in the unselected memory area 2', which lead from the selected bit line BLk to the unselected word lines, which are at the equipotential voltage Veq, are shown in FIG. 5—and also in all further figures—by the resistance Rpar'. In this case, Rpar' denotes the parallel circuit including the unselected memory cells 3'. In this case, this nonreactive resistance Rpar' is relatively much smaller than the cell resistance Rc, which means that even small potential differences across Rpar' can cause comparatively large parasitic signals or currents.

Figure 5:
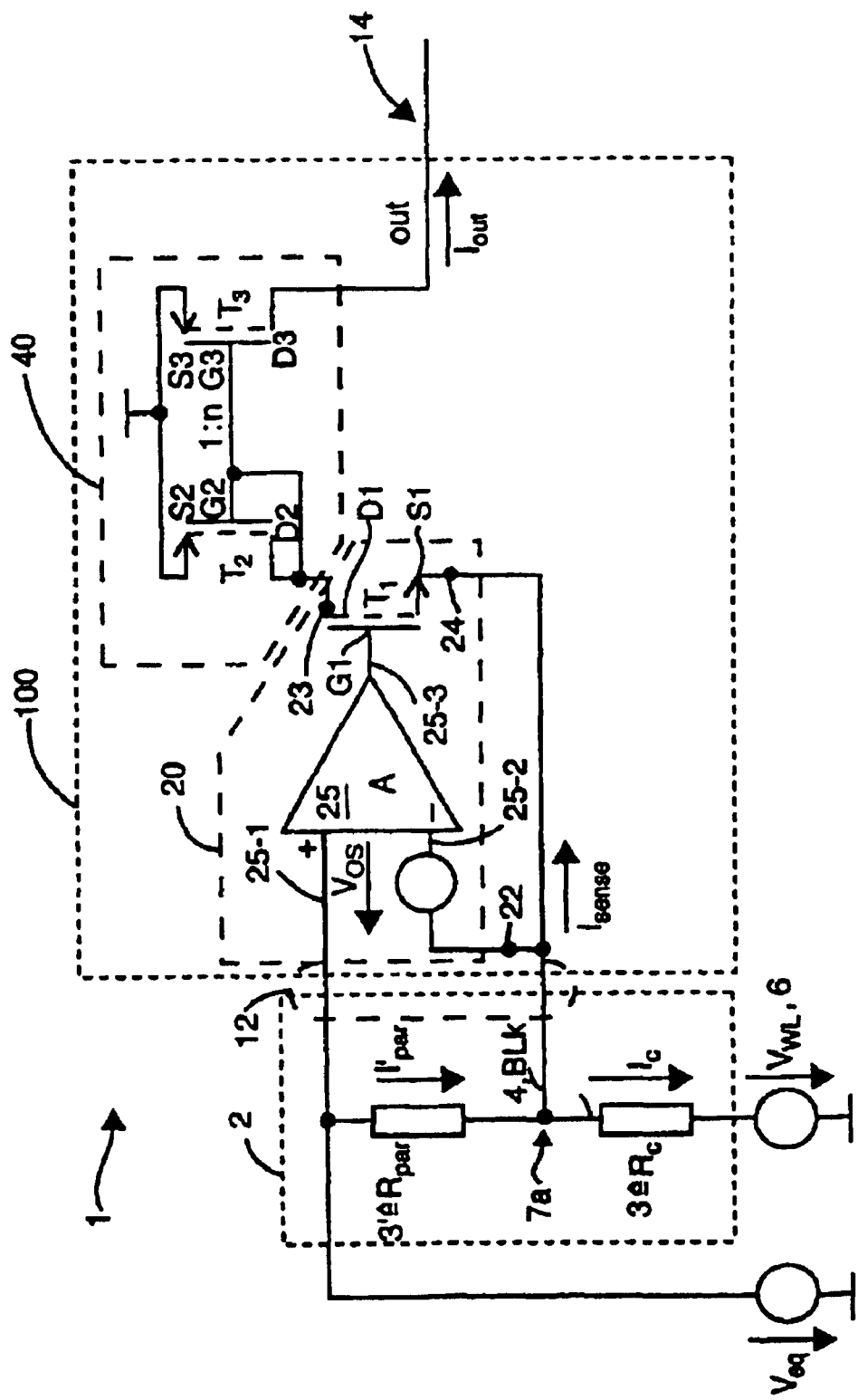
FIG. 5 is a schematic view showing a sense amplifier configuration according to the prior art.

The aim of the conventional sense amplifier 100 shown in FIG. 5 is to adjust and control the voltage applied to the end of the bit line BLk to the value of the equipotential voltage Veq as precisely as possible. As a result, virtually no potential difference would drop across the resistance Rpar', and the corresponding parallel-flowing current Ipar through the unselected memory area 2' would be negligible. This would then result in virtually the entire cell current Ic being able to flow via the selected memory cell 3, via the source follower T1, with amplification by factor n amplified by the current mirror 40, to the output area 14 of the conventional sense amplifier configuration 100 in the form of an output current Iout.

This ideal reading principle only works correctly, however, if the inherent offset voltage Vos of the conventional sense amplifier configuration 100 or of its operational amplifier 25 is negligible or zero so that, with sufficiently high gain A, the voltage on the selected bit line BLk can be controlled to the value of the equipotential voltage Veq as precisely as possible.

However, just relatively low offset voltages Vos in the range below 1 millivolt on the operational amplifier 25 are enough for the cell current Ic not to flow into the sense amplifier 100, but rather just to equalize the parasitic current Ipar=Vos/Rpar', which then emerges through the unselected memory area 2'. The amplifier 100 or the operational amplifier 25 then controls the voltage on the selected bit line BLk approximately to the value Veq−Vos.

With a negative offset voltage Vos, the amplifier 25 would control the voltage on a selected bit line BLk approximately to the value Veq+Vos. In this case, however, a current change on the bit line node 7a due to the connection of Rc to the word line voltage or reading voltage Vwl would always be visible as an amplified output current from the sense amplifier 100. This is not sufficient for practical use, however, since with a distribution over the statistical mean, both positive and negative offset voltages Vos with magnitudes of entirely a few millivolts can arise.

One conventional solution to this problem that is often applied is achieved by offset-compensated operational amplifiers. As a result, remaining offset voltages in the operational amplifier 25 used, which are clearly below 1 mV, can be achieved. However, a drawback of this method is that a plurality of clock phases are required for trimming the amplifier. This is a great drawback for use in sense amplifiers 100 in memory applications, because it results in relatively long read-access times and sometimes also results in a relatively high space requirement in the semiconductor memory layout.

Figure 2:
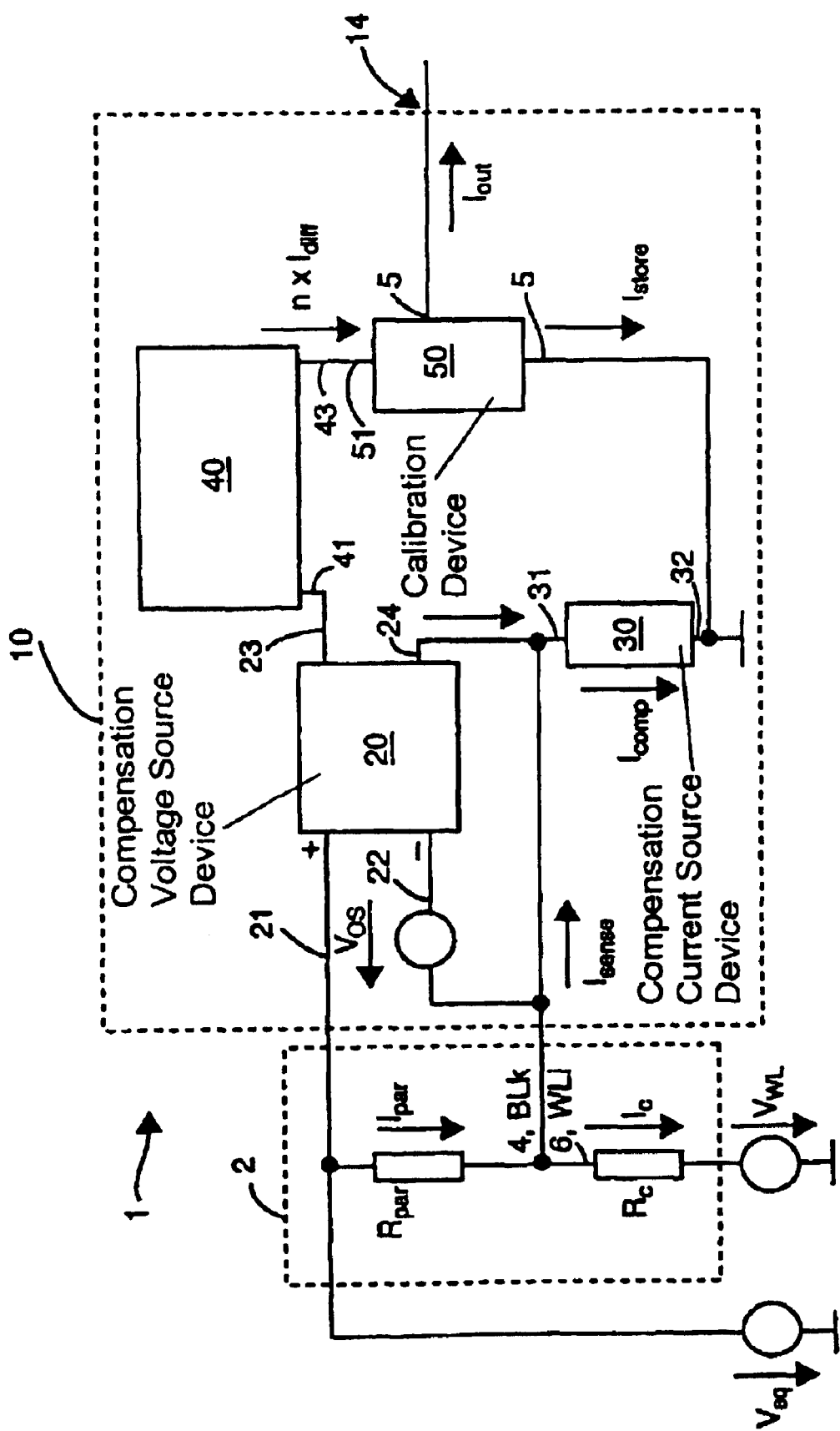
FIG. 2 is a schematic view showing a first embodiment of the sense amplifier configuration.

FIG. 2 now shows the basic configuration of a first embodiment of the inventive sense amplifier configuration 10 in the form of a block diagram, where components and sections which have the same construction or have the same action as in the figures described previously have identical references with respect to the preceding figures, and a detailed description of these elements is dispensed with at this point.

In comparison with the prior-art configuration shown in FIG. 5, the embodiment shown in FIG. 2 is first additionally provided with a compensation current source device 30, having connections 31 and 32, connected between the selected bit line device BLk or the selected access line device 4 and ground. The first connection 31 of the compensation current source device 30 is connected to the second output connection 24 and the second input connection 22 of the compensation voltage source device 20 and, correspondingly, to the selected and connected bit line device BLk or access line device 4. Secondly, to allow for current overcompensation, a corresponding calibration device 50 with connections 51, 52 and 53 is provided between the amplifier device 40 and the output area 14 of the sense amplifier configuration 10.

The compensation current source device 30 delivers a compensation current Icomp which corresponds to or exceeds the ideal value:

$$\frac{Vos}{Rpar'\|Rc} = \frac{Vos}{Rpar}$$

as far as possible.

To avoid any offset problems regarding current overcompensation by the compensation current source device 30, the calibration device 50 is provided. Before a reading state in the sense amplifier configuration 10, the calibration device 50 can isolate the output area 14 of the sense amplifier configuration 10 and can store the correspondingly overcompensated current Icomp, possibly having been amplified, in the calibration device 50 and, when a read state exists in the sense amplifier configuration 10, can supply it again for compensation purposes as appropriate when the output area 14 of the sense amplifier configuration 10 is connected.

Figure 3:
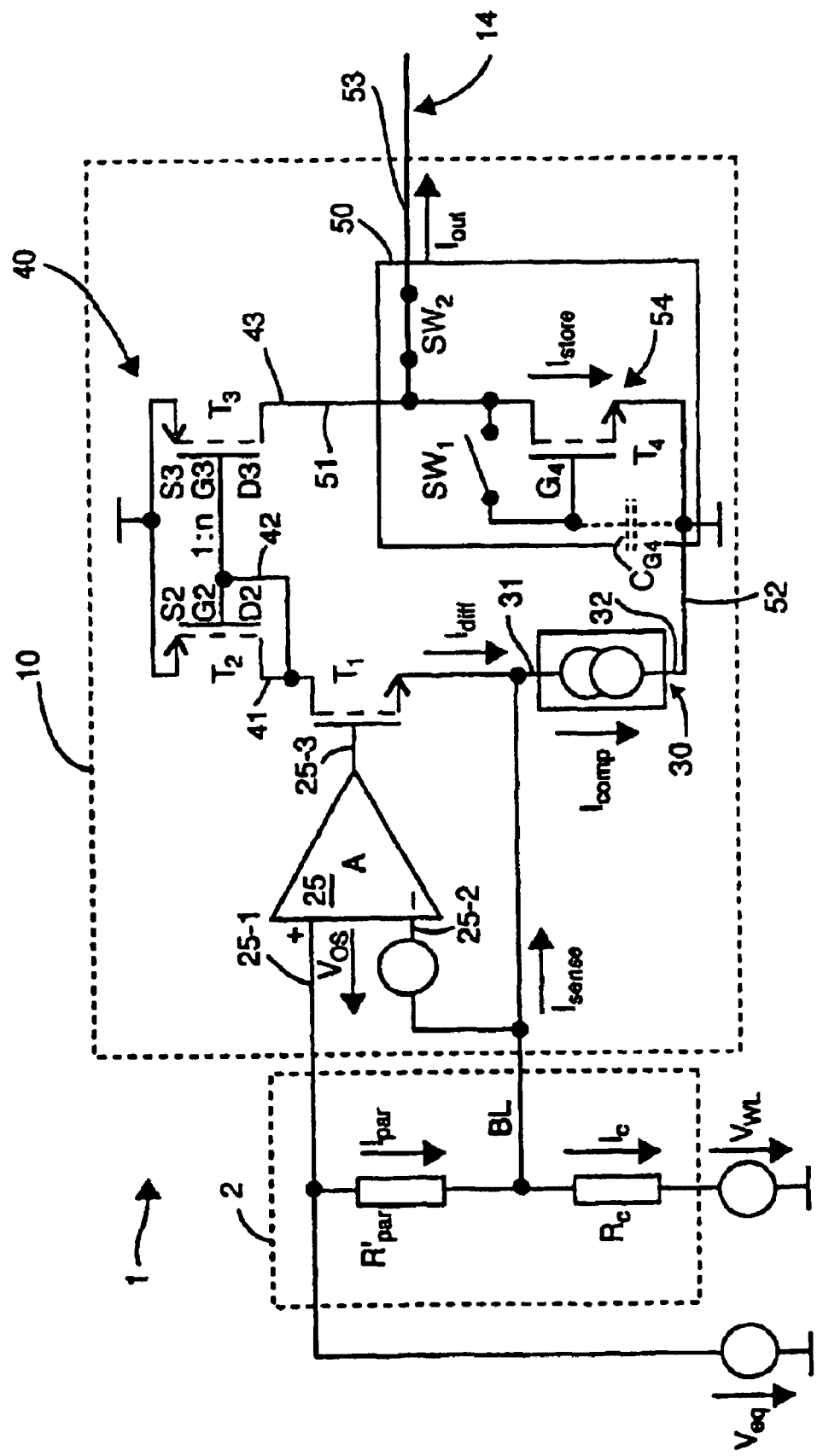
FIG. 3 is a schematic view showing a second embodiment of the sense amplifier configuration.

FIG. 3 shows a more detailed illustration of the embodiment from FIG. 2 in the form of a schematic circuit diagram, where again circuit elements that are identical or have the same action are provided with identical references, and the corresponding descriptions are not repeated.

In this case, the compensation voltage source device 20 is again formed, as in the case of the embodiment from FIG. 5, by a series circuit including an operational amplifier 25 and a MOSFET T1. The MOSFET T1 is used as a source follower for current transfer to the amplifier device 40 and MOSFET T1 is in the embodiment shown in FIG. 5.

Before the reading operation, all the word lines in the memory area 2 are at the same equipotential voltage or equalization voltage Veq. Upon selection, the reading potential or word line potential Vwl is then supplied as a result of corresponding selection.

The task of the operational amplifier 25 with the gain A is to hold constant the voltage applied to the end of the bit line via the source follower or MOSFET T1 and the compensation current source device 30 with the corresponding compensation current Icomp. The only important factor in this context is the controlled constancy of the bit line voltage on the bit line BLk. The absolute value of the potential difference can deviate freely from the ideal voltage Veq by an offset voltage Vos, even one that is unknown, however.

For a positive offset voltage Vos, the operational amplifier 25 adjusts the voltage on the selected bit line BLk approximately to the value Veq−Vos. In this case, the compensation current Icomp ideally has a value of:

$$\frac{Vos}{Rpar'\|Rc} = \frac{Vos}{Rpar}.$$

If the value of the compensation current Icomp is below this value, then a value greater than Veq−Vos becomes established at the end of the bit line BLk, in which case the control by the operational amplifier 25 fails. For further reading of the selected memory cell 3, this would have the great drawback that the usable output signal Iout from the sense amplifier 10 is reduced.

However, because it is not always possible, for example due to the variation in the offset voltage Vos, to adjust the compensation current Icomp to the ideal value, for example because trimming or self-calibration would be too complex, the value of Icomp is possibly adjusted to be sufficiently greater than the ideal value.

According to Kirchhoff's laws, the current:

$$Idiff = \frac{Vos}{Rpar'\|Rc} - Icomp$$

would then drain via the transistor sequence T1, T2, and T3 to the output of the sense amplifier 10, having been amplified in the factor 10, however. This could sometimes result in the output current Iout produced making detection of the digital value "0" or "1" impossible on the sense amplifier configuration 10 if the compensation current Icomp is set too high.

To avoid this offset problem, the calibration device 50 in the embodiment from FIG. 3 is thus constructed with switches SW1 and SW2 and with a transistor device T4 used as a current storage element. Before the reading operation, the switching device SW1 is closed, and the excess current Idiff flows into the transistor diode of the transistor device T4. The switch SW2 for the output area 14 is not closed in this cases, but rather is open.

As the reading cycle progresses, the switch SW1 is then opened and the switch SW2 is closed. The voltage which has built up across the gate capacitor CG4 in the transistor device T4 when the switch SW1 is closed is maintained in this case. When the switch SW1 has been opened, the transistor device T4 now operates as a current store and delivers the storage current Istore. The transistor device and in particular the gate capacitor CG4 are now used as a current source and will thus remove the excess current n×Idiff from the output node of the amplifier configuration 10.

The reading operation then proceeds as follows: before reading, all the cells 3 on the selected bit line BLk are at the equipotential voltage Veq via the transversely running word lines. The equalization or compensation current Icomp is used to prescribe a correspondingly high current so that the operational amplifier 25 remains at the appropriate operating point in order to adjust the bit line BLk to approximately Veq−Vos and keep it there for the rest of the reading operation as well.

When the switch SW1 is closed, the excess current n×Idiff drains into the diode in the transistor device T4. The switch SW2 remains open in order not to disturb the calibration state.

Next, the switch SW1 is opened, and as soon as this has happened the switch SW2 is closed and the memory cell is selected using the associated word line WLi, as shown in FIG. 3. The selected bit line BLk is now at the equipotential voltage Veq merely via the parallel resistance Rpar', and is at the word line voltage or reading voltage Vwl via the cell resistance Rc of the selected memory cell 3.

Because the operational amplifier 25 continues to hold the voltage at the end of the selected bit line BLk at the value Veq−Vos, Kirchhoff's law can be considered only in a first approximation for the currents on the node 7a of the bit line BLk. The control of the operational amplifier 25 implies that the parallel current Ipar remains approximately constant. The compensation current Icomp has likewise been prescribed to be constant at this time.

As a result of the changeover from the equipotential voltage Veq to the word line voltage Vwl, the comparatively small current Vos/Rc drops away parallel to Ipar. Instead, approximately the larger cell current Ic=(Veq−Vwl)/Rc now acts upon the bit line node 7a of the selected bit line BLk due to the selected memory cell 3. Since Ipar and Icomp are constant, the cell current Rc has to drain virtually completely via the source follower T1. In this context, the cell current Ic can still be amplified by the factor n via the current mirror or the amplification device 40. Since the current store 54 or T4 removes [lacuna] via the storage current Istore to the excess current Idiff from the output area 14 of the sense amplifier configuration 10, the cell current Ic amplified by the factor n, in a first approximation, flows via the closed switch SW2 from the output of the sense amplifier configuration 10.

The configuration works in a similar manner for negative offset voltage Vos as well. In this context, the operational amplifier 25 controls the voltage on the selected bit line BLk to approximately the value Veq+Vos. The only important factor in this context is that the operational amplifier 25 in the compensation voltage source device 20 is situated in a working control loop. This is ensured in this case even without the presence of the compensation current source device 30 and the corresponding compensation current Icomp. However, the arithmetic sign of Vos is not necessarily known in this case, which implies that Icomp should possibly always be necessarily introduced. This is not a problem, however, so long as the current store 54 in the calibration device 50, particularly the switch SW1 and the transistor device T4, can be used to compensate for the excess current Idiff.

The following aspects are particularly important with respect to the present invention:

- The offset voltage Vos of the compensation voltage source device 20 and particularly of the operational amplifier 25 present therein is of no significance to the reading operation.
- The compensation current source device 30 and particularly the compensation current Icomp can be used to hold the circuit for all offset voltage Vos [lacuna] the respective amplification device 25 at a working operating point.
- The compensation current source device 30 and the compensation current Icomp can be permanently set or calibrated.
- The current store 54 in the calibration device 50 and particularly the switching device SW1 and the transistor device T4 compensate for excess compensation currents Idiff.
- For exact calibration of the compensation current Icomp on the basis of the offset voltage Vos, the current store can be dispensed with as a result of the elements SW1 and T4.
- The reading circuit can be implemented very quickly by virtue of the simple timing for the switches SW1 and SW2.

Figure 4:
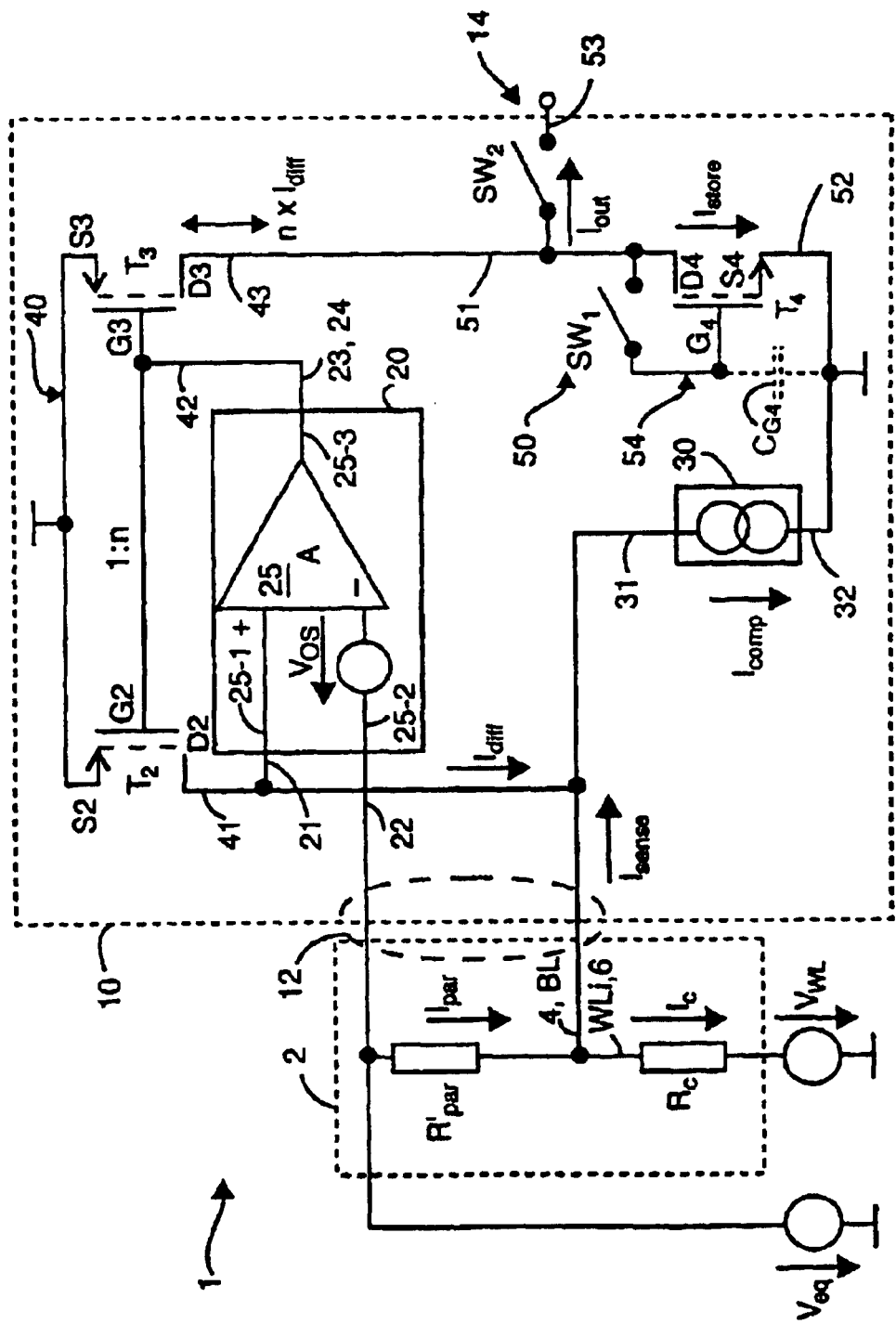
FIG. 4 is a schematic view showing a third embodiment of the sense amplifier configuration.

FIG. 4 shows another embodiment of the present inventive sense amplifier configuration. In this case, elements that are identical or have the same action with respect to the embodiments described up to now are provided with identical references and are not explained in further detail at this point.

In the embodiment provided in FIG. 4, the operational amplifier 25 provided in the compensation voltage source device 20 controls the voltage of the selected bit line BLk not using a source follower, but rather directly using a PMOS transistor T2 in the amplifier device 40, in which case sufficient compensation for the control loop is required. In this context, the PMOS transistor T4 does not need to be produced externally, for example in an external amplifier device 40, but rather can also be regarded as part of the output stage of the operational amplifier 25 in the compensation voltage source device 20 if appropriate. In addition, the circuit shown in FIG. 4 can also be produced using NMOS transistors in a complementary manner. In this case, the following points then need to be observed, however, namely keeping the voltage on a selected bit line BLk constant, eliminating the offset problems and the amplifier by virtue of the compensation current source device 30, and also eliminating the compensation current Icomp, and compensating for excess compensation current by virtue of a corresponding current store 54 and corresponding elements SW1 and T4.

We claim:

1. A sense amplifier configuration for a memory device having a memory area including a plurality of memory elements having a memory state and further including access line devices having at least one of bit line devices and word line devices for addressing the memory elements, the sense amplifier comprising:
    an input area configured to be connected during operation to at least a selected one of the access line devices for selected memory elements in the memory area in order to ascertain the memory state for at least one of the selected memory elements;
    an output area outputting during operation an output signal representing the ascertained memory state;
    a compensation voltage source device configured to control a voltage applied to the selected access line device in relation to an unselected memory area during operation; and
    a compensation current source device generating an electric compensation current during operation and supplying the electric compensation current to at least one of the access line devices, a time profile of the compensation current being chosen to generate a constant potential difference over time and during operation in interaction with said compensation voltage source device on the selected access line device relative the unselected memory area.

2. The sense amplifier configuration according to claim 1, wherein the memory cell configuration being read includes MRAM cells.

3. The sense amplifier configuration according to claim 1, wherein the memory area in the memory device is read using an electric current flowing through the selected memory elements.

4. The sense amplifier configuration according to claim 3, wherein the selected memory elements are memory cells.

5. The sense amplifier configuration according to claim 1, wherein the output signal is output as an electric current.

6. The sense amplifier configuration according to claim 1, wherein said compensation voltage source device has first and second input connections, first and second output connections, and an inverting amplifier device.

7. The sense amplifier configuration according to claim 6, wherein said inverting amplifier device is an operational amplifier.

8. The sense amplifier configuration according to claim 7, wherein:
    said operational amplifier device has a noninverting input and an inverting input; and
    said first and second input connections of said compensation voltage source device are connected firstly to said noninverting input and said inverting input of said operational amplifier device and secondly via said input area to a potential.

9. The sense amplifier configuration according to claim 8, wherein the potential is a deactivation potential.

10. The sense amplifier configuration according to claim 8, wherein the potential is an equalization potential.

11. The sense amplifier configuration according to claim 8, wherein the potential is of the unselected memory area (2').

12. The sense amplifier configuration according to claim 8, wherein the potential is at least of a given one of the access line devices corresponding to the unselected memory area (2').

13. The sense amplifier configuration according to claim 8, wherein the voltage is of a system of unselected ones of the word lines.

14. The sense amplifier configuration according to claim 8, wherein the voltage is of the selected memory elements provided via the selected and connected one of the access line devices.

15. The sense amplifier configuration according to claim 7, wherein:
    said operational amplifier device has an output; and
    one of said output connections of said compensation voltage source device connects to said output of said operational amplifier device.

16. The sense amplifier configuration according to claim 15, wherein said one of said output connections of said compensation voltage source device connects to said output of said operation amplifier device via the selected and connected access line device to the selected memory element to allow the potential difference between the unselected memory area and the selected, connected access line device to be controlled by feedback.

17. The sense amplifier configuration according to claim 16, wherein the potential difference is constant over time.

18. The sense amplifier configuration according to claim 6, wherein said compensation current source device has a connection connecting said compensation current source device to the selected, connected access line device, in order to supply a compensation current at least in part to the selected, connected access line device during operation.

19. The sense amplifier configuration according to claim 18, wherein the selected, connected access line device is a selected, connected bit line device.

20. The sense amplifier configuration according to claim 18, wherein said connection connects said compensation current source device to said second input connection and said second output connection of said compensation voltage source device.

21. The sense amplifier configuration according to claim 1, wherein said compensation current source device provides a compensation current having a value at least equaling an electric current offset corresponding to the voltage offset in said compensation voltage source device via a resistive network of the memory elements in the entire memory area, the compensation current (Icomp) satisfying a relationship:

$$Icomp \geq \frac{Vos}{Rpar'\|Rc} = \frac{Vos}{Rpar},$$

where Rpar signifies a nonreactive resistance of the entire memory area and is represented as a parallel circuit including a nonreactive resistance Rpar' of the unselected memory area and a nonreactive resistance Rc of the selected memory elements.

22. The sense amplifier configuration according to claim 21, wherein said compensation current source device self-calibrates during operation in order to best approximate a value for the compensation current corresponding to:

$$\frac{Vos}{Rpar'\|Rc} = \frac{Vos}{Rpar}.$$

23. The sense amplifier configuration according to claim 1, further comprising an amplifier device disposed between said input area and said output area; said amplifier device receiving during operation an input signal representing the memory state of the selected and connected memory element via said input area, generating an amplified signal from the input signal, and outputting the amplified signal via said output area.

24. The sense amplifier configuration according to claim 23, wherein said amplifier device is a current amplifier device.

25. The sense amplifier configuration according to claim 23, wherein said amplifier device has an input connection configured to be connected during operation to said input area.

26. The sense amplifier configuration according to claim 25, wherein said input connection of said amplifier device is connected to the selected, connected access line device.

27. The sense amplifier configuration according to claim 26, wherein the selected, connected access line device is a selected, connected bit line device.

28. The sense amplifier configuration according to claim 26, wherein said input connection of said amplifier device is connected to said compensation current source device (30).

29. The sense amplifier configuration according to claim 25, wherein said amplifier device has an output connection configured to be connected during operation to said output area.

30. The sense amplifier configuration according to claim 25, wherein said amplifier device has two transistor devices having source, drain and gate regions, said source regions of said two transistor devices are connected to one another, and said gate regions of said transistors are connected, and said drain regions of said transistor devices are connected to said input connection and said output connection of said amplifier device.

31. The sense amplifier configuration according to claim 30, wherein said two transistor devices are MOSFETs.

32. The sense amplifier configuration according to claim 30, wherein said amplifier device has a second input connection connected to said gate regions of said transistor devices.

33. The sense amplifier configuration according to claim 29, further comprising a calibration device configured to equalize at least one of an excess compensation current and an excess output signal from said amplifier device during operation and having alternately activatable current storage and current release functions.

34. The sense amplifier configuration according to claim 33, wherein said calibration device is disposed between said output connection of said amplifier device and said output area.

35. The sense amplifier configuration according to claim 34, wherein said calibration device has an input connection connected to said output connection of said amplifier device and a first output connection connected to said output area.

36. The sense amplifier configuration according to claim 33, wherein said calibration device has a second output connection connected to said compensation current source device.

37. The sense amplifier configuration according to claim 33, wherein said calibration device has a current storage device performing the current storage and the current release functions.

38. The sense amplifier configuration according to claim 37, wherein said current storage device is configured to store at least one of an excess compensation current and an excess output signal during operation before a reading state and to supply the at least one of an excess compensation current and an excess output signal during the reading state.

39. The sense amplifier configuration according to claim 38, wherein said current storage device stores the excess compensation current from said compensation current source device before the reading state and supplies the excess compensation current to said compensation current source device during the reading state.

40. The sense amplifier configuration according to claim 38, wherein said current storage device stores the excess output signal from said amplifier device before the reading state and supplies the excess output signal to said amplifier device during the reading state.

41. The sense amplifier configuration according to claim 37, wherein said current storage device is a transistor device.

42. The sense amplifier configuration according to claim 41, wherein said transistor device is a MOSFET.

43. The sense amplifier configuration according to claim 37, wherein said current storage device includes a transistor device.

44. The sense amplifier configuration according to claim 42, wherein:
said calibration device has an input connection and an output connection; and
said transistor device has a drain region and a source region;
said drain region is connected to said input connection of said calibration device; and
said source region is connected to said compensation current source device via said output connection of said calibration device.

45. The sense amplifier configuration according to claim 44, wherein said current storage device has a switching device connecting and isolating said gate region of said transistor device in said current storage device and said drain region before and during a reading state, to allow a gate capacitor in said gate region of said transistor device to be switched as a current storage element.

46. The sense amplifier configuration according to claim 33, wherein said calibration device has an input connection, an output connection, and a further switching device configured to make a direct electrical connection between said input connection and said output connection of said calibration device during a reading state and can break said direct electrical connection before a reading state.

* * * * *